United States Patent
Lee (10) Patent No.: US 8,873,326 B2
(45) Date of Patent: *Oct. 28, 2014

(54) MEMORY DEVICE

(71) Applicant: SK Hynix Inc., Gyeonggi-do (KR)

(72) Inventor: Yo-Sep Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 20 days.

This patent is subject to a terminal disclaimer.

(21) Appl. No.: 13/717,944

(22) Filed: Dec. 18, 2012

(65) Prior Publication Data

US 2014/0064009 A1 Mar. 6, 2014

(30) Foreign Application Priority Data

Aug. 30, 2012 (KR) .................. 10-2012-0095668

(51) Int. Cl.
*G11C 7/00* (2006.01)
*G11C 11/406* (2006.01)

(52) U.S. Cl.
CPC .... *G11C 11/40615* (2013.01); *G11C 11/40618* (2013.01); *G11C 11/40611* (2013.01)
USPC .................. 365/222; 365/230.01; 365/230.06; 365/233.14; 365/236; 365/239

(58) Field of Classification Search
CPC .................. G11C 11/40618; G11C 11/40615; G11C 11/40611

USPC .................. 365/222, 230.01, 230.03, 230.06, 365/233.14, 236, 239
See application file for complete search history.

(56) References Cited

U.S. PATENT DOCUMENTS 8,130,585 B2 * 3/2012 Schreck et al. ............... 365/222
8,391,090 B2 * 3/2013 Koshizuka ..................... 365/193
8,413,007 B2 * 4/2013 Pawlowski et al. ........... 714/754

FOREIGN PATENT DOCUMENTS

KR 1020120020315 3/2012

* cited by examiner

*Primary Examiner* — Fernando Hidalgo
(74) *Attorney, Agent, or Firm* — IP & T Group LLP

(57) ABSTRACT

A memory device includes a plurality of memory blocks configured to be refreshed in response to respective refresh signals; a command decoder configured to decode an external input command to generate an internal refresh command; a refresh control unit configured to activate a first number of refresh signals corresponding to the first number of memory blocks when the internal refresh command is activated and a first mode is set, and to activate a second number of refresh signals corresponding to the second number of memory blocks when the internal refresh command is activated and a second mode is set, the second number being smaller than the first number; and an address counter configured to change the row address transferred to the memory blocks when a predetermined one of the refresh signals is activated.

17 Claims, 6 Drawing Sheets

MEMORY DEVICE

CROSS-REFERENCE TO RELATED APPLICATIONS

The present application claims priority of Korean Patent Application No. 10-2012-0095668, filed on Aug. 30, 2012, which is incorporated herein by reference in its entirety.

BACKGROUND

1. Field

Exemplary embodiments of the present invention relate to a memory device, and more particularly, to a refresh technology of a memory device.

2. Description of the Related Art

A memory cell of a memory device may include a transistor serving as a switch and a capacitor storing charges (data). A 'high' (logic 1) and a 'low' (logic 0) of the data are divided according to whether there is no charge in the capacitor within the memory cell, that is, according to whether a terminal voltage of the capacitor is high or low.

The data are stored in a form in which the charge is accumulated in the capacitor and therefore, in principle, there is no power consumption. However, an initial charge amount stored in the capacitor may be extinguished due to leakage current caused by a PN junction of an MOS transistor and therefore, data may be lost. In order to prevent data from being lost, there is a need to read the data within the memory cell before the data are lost and recharge the normal charge amount again according to the read information. The storage of the data is maintained by periodically repeating the operation. The recharging process of the cell charge is referred to as a refresh operation.

The refresh operation is sorted into an auto refresh operation performed when a refresh command is applied from a memory controller to a memory device and a self refresh operation performed by a memory itself when the memory controller sets the refresh period. Meanwhile, the current auto refresh operation is defined as refreshing each row in all the banks in the memory device, respectively, when the memory controller applies the refresh command to the memory device. However, all the banks are simultaneously refreshed at the time of the auto refresh operation and therefore, peak current consumption of the memory device is increased such that power shortage, noise increase, and the like, may occur. Therefore, a need exists for a technology of resolving the concerns.

SUMMARY

Exemplary embodiments of the present invention are directed to a technology of supporting a mode in which all the banks are refreshed when an auto refresh command is applied, a mode in which some banks are refreshed, and the like and sharing an address counter used at the time of a refresh operation while an independent refresh operation is performed for each bank.

Another embodiment of the present invention is directed to a technology of supporting a self refresh operation by performing an auto refresh operation in which several modes are supported.

In accordance with an embodiment of the present invention, a memory device includes a plurality of memory blocks configured to be refreshed in response to refresh signals corresponding thereto, a command decoder configured to decode an external input command to generate an internal refresh command, a refresh control unit configured to activate a first number of refresh signals corresponding to the first number of memory blocks by using a row address, when the internal refresh command is activated and a first mode is set, and to activate a second number of refresh signals corresponding to a second number of memory blocks by using the row address, when the internal refresh command is activated and a second mode is set, the second number being smaller than the first number, and an address counter configured to change the row address transferred to the memory blocks when a predetermined one of the refresh signals is activated.

In accordance with another embodiment of the present invention, a memory device includes a plurality of memory blocks configured to be refreshed in response to refresh signals corresponding thereto, a command decoder configured to decode an external input command to generate an internal refresh command, a self refresh entry command, and a self refresh exit command, a self refresh control unit configured to start periodic activation of a self refresh command in response to the activation of the self refresh entry command and stop the activation of the self refresh command in response to the activation of the self refresh exit command, a refresh control unit configured to activate a first number of refresh signals corresponding to the first number of memory blocks by using a row address, when one of the internal refresh command and the self refresh command is activated and a first mode is set, and to activate a second number of refresh signals corresponding to the second number of memory blocks by using the row address when one of the internal refresh command and the self refresh command is activated and a second mode is set, the second number being smaller than the first number, and an address counter configured to change the row address transferred to the memory blocks when a predetermined one of the refresh signals is activated.

In accordance with a still another embodiment of the present invention, a memory device includes a plurality of memory blocks configured to be refreshed in response to refresh signals corresponding thereto, a command decoder configured to decode an external input command to generate an internal refresh command, a self refresh entry command, and a self refresh exit command, a self refresh control unit configured to start periodic activation of a self refresh command in response to the activation of the self refresh entry command and stop the activation of the self refresh command in response to the activation of the self refresh exit command, a refresh control unit configured to activate a first number of refresh signals corresponding to all of the plurality of memory blocks by using a row address, when the internal refresh command is activated and a first mode is set, to activate a second number of refresh signals corresponding to a second number of memory blocks by using the row address, when the internal refresh command is activated and a second mode is set, the second number being smaller than the number of all of the memory blocks, and to activate the refresh signals corresponding to all of the plurality of memory blocks regardless of the setting of the first mode and the second mode when the internal refresh command is activated, and an address counter configured to change the row address transferred to the memory blocks when a predetermined one of the refresh signals is activated.

DETAILED DESCRIPTION

Hereinafter, optimal embodiments of the present invention will be described in detail with reference to the accompanying drawings so that those skilled in the art may easily practice the technical ideas of the present invention.

Figure 1:
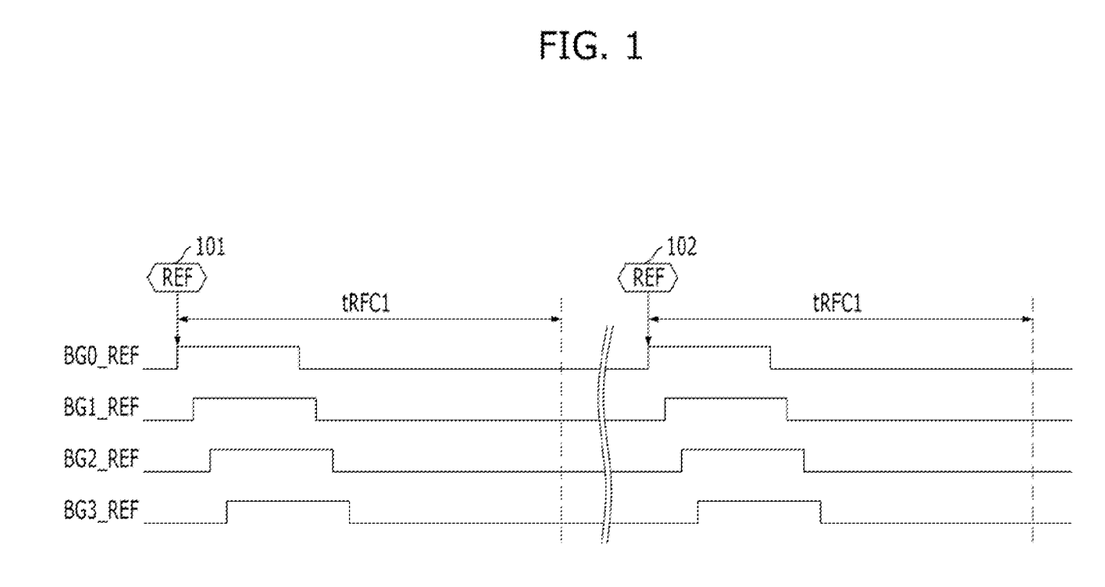
FIG. 1 is a diagram illustrating a refresh operation of a memory device when a refresh mode is set as a first mode.
Figure 2:
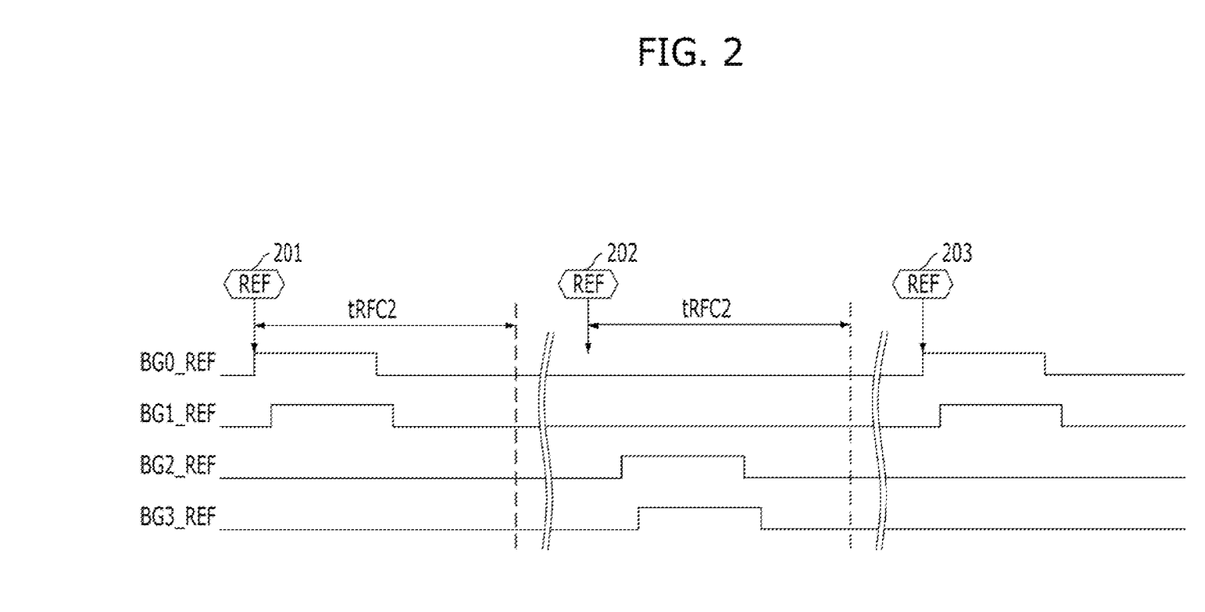
FIG. 2 is a diagram illustrating the refresh operation of the memory device when the refresh mode is set as a second mode.
Figure 3:
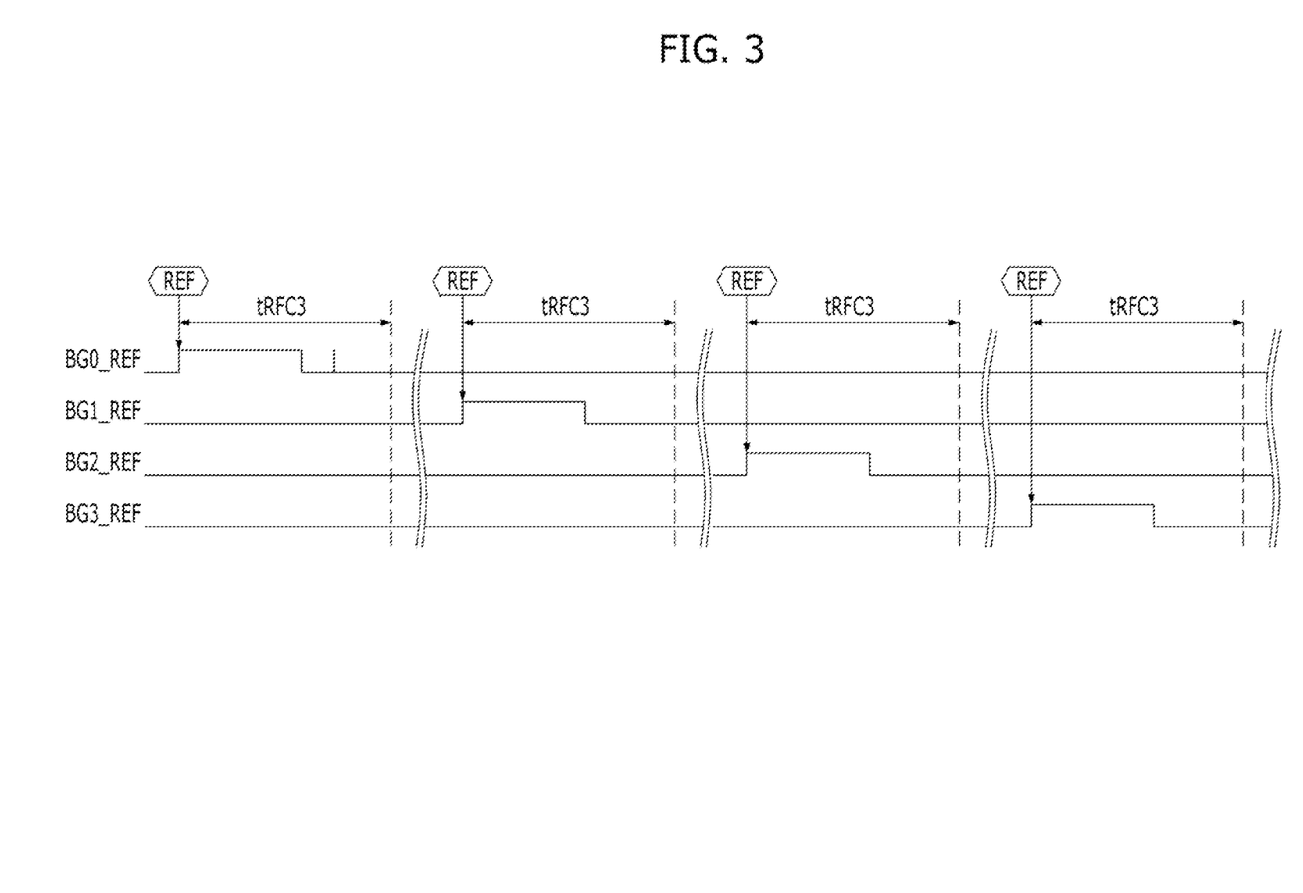
FIG. 3 is a diagram illustrating the refresh operation of the memory device when the refresh mode is set as a third mode.

FIGS. 1 to 3 are diagrams for describing a refresh operation of a memory device according to a refresh mode.

FIG. 1 is a diagram illustrating a refresh operation of a memory device when a refresh mode is set as a first mode. The first mode may be fine granularity refresh (FGR) 1 in the first mode, each row is refreshed in all the bank groups when a refresh command is applied to the memory device. Referring to FIG. 1, bank group 0 to bank group 3 are refreshed in response to a refresh command 101. For reference, BG0_REF to BG3_REF show that the corresponding bank groups are refreshed. Further, bank group 0 to bank group 3 are refreshed in response to a refresh command 102. Here, a row subsequent to the row that is refreshed at the time of the application of the refresh command 101 is refreshed at the time of the application of the refresh command 102. For example, when a hundredth row of bank group 0 to bank group 3 is refreshed at the time of the application of the refresh command 101, a hundred first row of bank group 0 to bank group 3 is refreshed at the time of the application of the refresh command 102. All the bank groups are refreshed in response to a one-time refresh command in the first mode, such that the refresh operation period, that is, a refresh cycle tRFC is relatively largely set. For reference, BG0_REF to BG3_REF are activated at a slight time difference, which is to reduce a peak current due to the refresh operation. Differently from FIG. 1, BG0_REF to BG3_REF may also be activated simultaneously.

FIG. 2 illustrates the refresh operation of the memory device when the refresh mode is set as a second mode. The second mode may be a FGR2 mode. In the second mode, each row in a half of all the bank groups is refreshed when the refresh command is applied to the memory device. Referring to FIG. 2, bank group 0 and bank group 1 are refreshed in response to the refresh command 201 and bank group 2 and bank group 3 are refreshed in response to the refresh command 202. When a refresh command 203 subsequent to the refresh command 202 is applied again, bank group 0 and bank group 1 are refreshed again. In this case, the row refreshed in response to the refresh command 202 in bank group 0 and bank group 1 is a row next to the row that is refreshed at the time of the refresh command 201. A half of all the bank groups are refreshed in response to a one-time refresh command in the second mode, such that the refresh operation period, that is, tRFC is set to be smaller than that of the first mode.

FIG. 3 is a diagram illustrating a refresh operation of a memory device when a refresh mode is set as a first mode. The third mode may be a FGR4 mode. In the third mode, each row in a quarter of a half of all the bank groups is refreshed when the refresh command is applied to the memory device. Referring to FIG. 3, bank group 0 is refreshed in response to a refresh mode 301, bank group 1 is refreshed in response to a refresh command 302, bank group 2 is refreshed in response to a refresh command 303, and bank group 3 is refreshed in response to a refresh command 304. When a refresh command (not illustrated) subsequent to the refresh command 304 is applied again, bank group 0 is refreshed again. In this case, the row refreshed in bank group 0 and bank group 1 is a row next to the row that is refreshed at the time of the refresh command 301. A quarter of all the bank groups is refreshed in response to the refresh command in the third mode, such that the refresh operation period, that is, tRFC is set to be smaller than that of the first mode.

Figure 4:
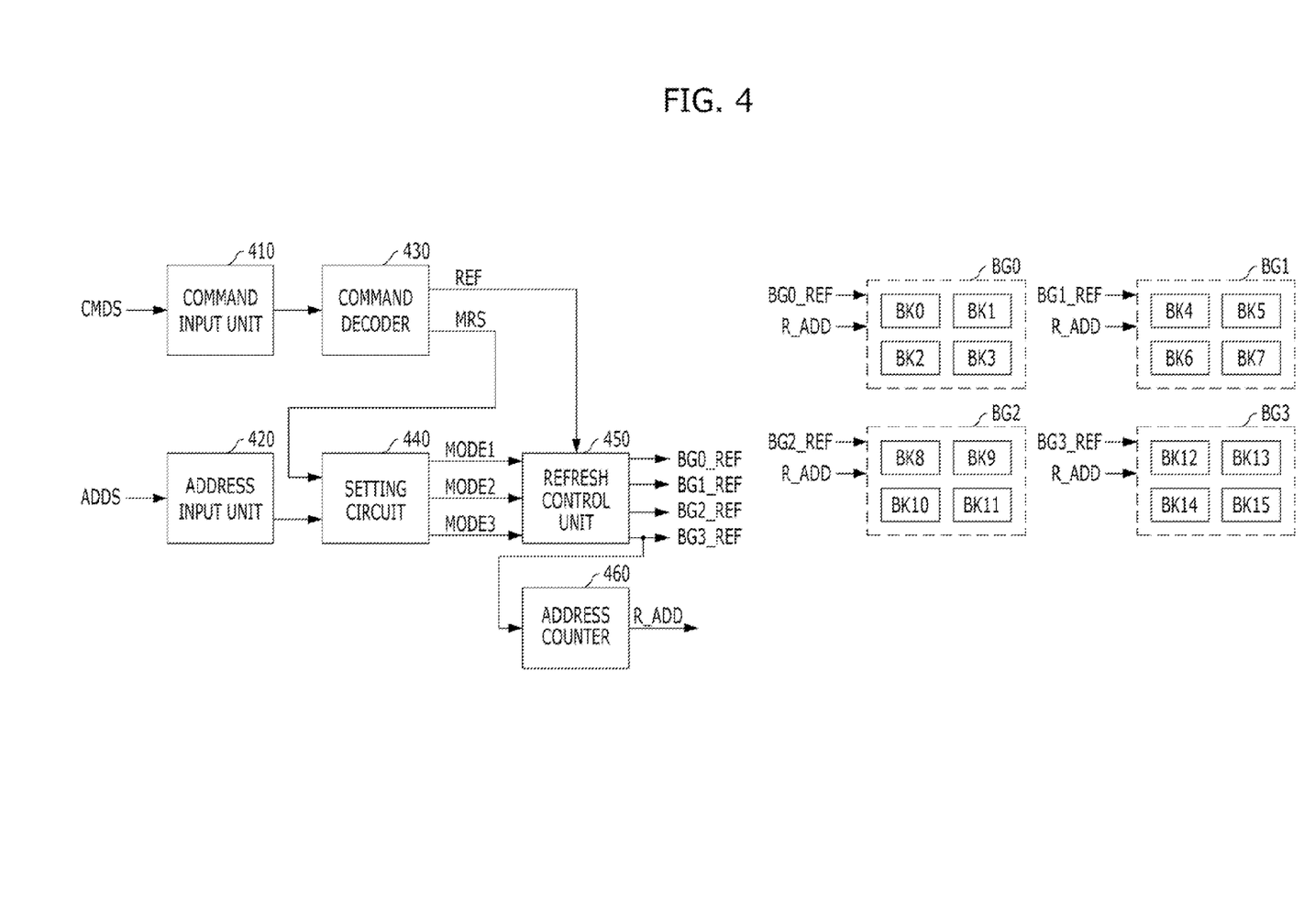
FIG. 4 is a diagram illustrating the memory device in accordance with an embodiment of the present invention.

FIG. 4 is a diagram of the memory device in accordance with an embodiment of the present invention.

Referring to FIG. 4, a memory device may include a command input unit 410, an address input unit 420, a command decoder 430, a setting circuit 440, a refresh control unit 450, an address counter 460, and bank groups BG0 to BG3. In FIG. 4, only elements for the refresh operation in the memory device are illustrated, but, elements for operations that are not directly associated with the present invention, such as read, write, and the like, are not illustrated.

The command input unit 410 receives commands CMDs applied from a memory controller and an address input unit 420 receives addresses ADDs applied from the memory controller. Each of the command CMDs and address ADDs includes multi-bit signals.

The command decoder 430 decodes the commands CDMs input through the command input unit 410 to generate a setting command MRS and an internal refresh command RFE. When a combination of the input command signals CMDs corresponds o a mode register set (MRS), the setting command MRS is activated and when a combination of the input command signals CMDs represents an internal refresh command REF, the internal refresh command REF is activated. In addition to this, the command decoder 430 decodes the input command signals CMDs to generate commands such as active, precharge, read, write, self refresh entry, self refresh exit, and the like, that are used in the memory device.

The setting circuit 440 sets the refresh mode using the address ADDs input through the address input unit 420 at the time of the activation of the setting command MRS. The refresh mode may be a first mode, a second mode, or a third mode. Consequently, the refresh mode set by the setting circuit 440 becomes a refresh mode that is ordered by the memory controller. A signal MODE1 output from the setting circuit 440 is a signal that the setting of the first mode is ordered by the memory controller, a signal MODE2 is a signal that the setting of the second mode is ordered by the memory controller, and a signal MODE3 is a signal that the setting of the third mode is ordered by the memory controller.

The refresh control unit 450 controls the refresh operation of the memory in response to the modes MODE1 to MODE3 set by the setting circuit 440 and the internal refresh command REF. The refresh operation control of the refresh control unit 450 is performed by the activation of the refresh signals BG0_REF to BG3_REF. When the first mode is set, the refresh control unit 450 activates the refresh signals BG0_REF to BG3_REF as illustrated in FIG. 1 when the internal refresh command REF is activated. When the second mode is set, the refresh control unit 450 activates the refresh signals BG0_REF to BG3_REF as illustrated in FIG. 2 when the internal refresh command REF is activated. When the third mode is set, the refresh control unit 450 activates the refresh signals BG0_REF to BG3_REF as illustrated in FIG. 3 when the internal refresh command REF is activated.

The address counter 460 changes a value of a row address R_ADD transferred to the bank groups BG0 to BG3 when a predetermined one of the refresh signals BG0_REF to BG3_REF is activated. For example, the value of the row address R_ADD may be increased by 1 when the refresh signal is activated. Here, increasing the value of the row address R_ADD by 1 means changing the row address R_ADD so that an N+1-th row is selected next time when the previous N-th row is selected. The predetermined one refresh signal may be any of the refresh signals BG0_REF to BG3_REF. However, after all the bank groups BG0 to BG3 are refreshed once, changing the row address R_ADD can ensure a more stable operation, such that the last activated one of the refresh signals BG0_REF to BG3_REF may be a refresh signal input to the address counter 460. The refresh signal REF_BG3 is not activated early than other refresh signals BG0_REF to BG2_REF in any refresh mode and is activated at least, simultaneously with other refresh signals or is activated last, such that the refresh signal BG3_REF becomes the last activated one of the refresh signals BG0_REF to BG3_REF. For reference, the row address R_ADD generated from the address counter 460 is used only during the refresh operation and is not used during the read and write operations. During the read and write operations, the row address R_ADD generated from the address counter 460 is not used but the address input from the outside of the memory device is used.

Each of the bank groups BG0 to BG3 includes at least one bank. FIG. 4 illustrates that 16 banks BK0 to BK15 are present in the memory device and four banks is sorted into a single bank group to form all of the four bank groups BG0 to BG3, but the bank groups and the number of banks can be changed without limit according to a design. The bank groups BG0 to BG3 are refreshed in response to the refresh signals BG0_REF to BG2_REF corresponding thereto. For example, when the refresh signal BG0_REF is activated, the row selected by the row address is refreshed in all the banks BK0 to BK3 in the bank group BG0. Similarly, when the refresh signal BG2_REF is activated, the row selected by the row address is refreshed in all the banks BK8 to BK11 in the bank group BG2.

In accordance with the embodiment described with reference to FIG. 4, the address R_ADD counted by the address counter 460 is changed by using one refresh signal BG3_REF among the refresh signals BG0_REF to BG2_REF corresponding to each bank group BG0_BG3 rather than the internal refresh command REF. Therefore, the bank groups BG0 to BG3 can share a single address counter 460) while independent refresh operations for the bank groups BG0 to BG3 are performed according to the refresh mode.

Figure 5:
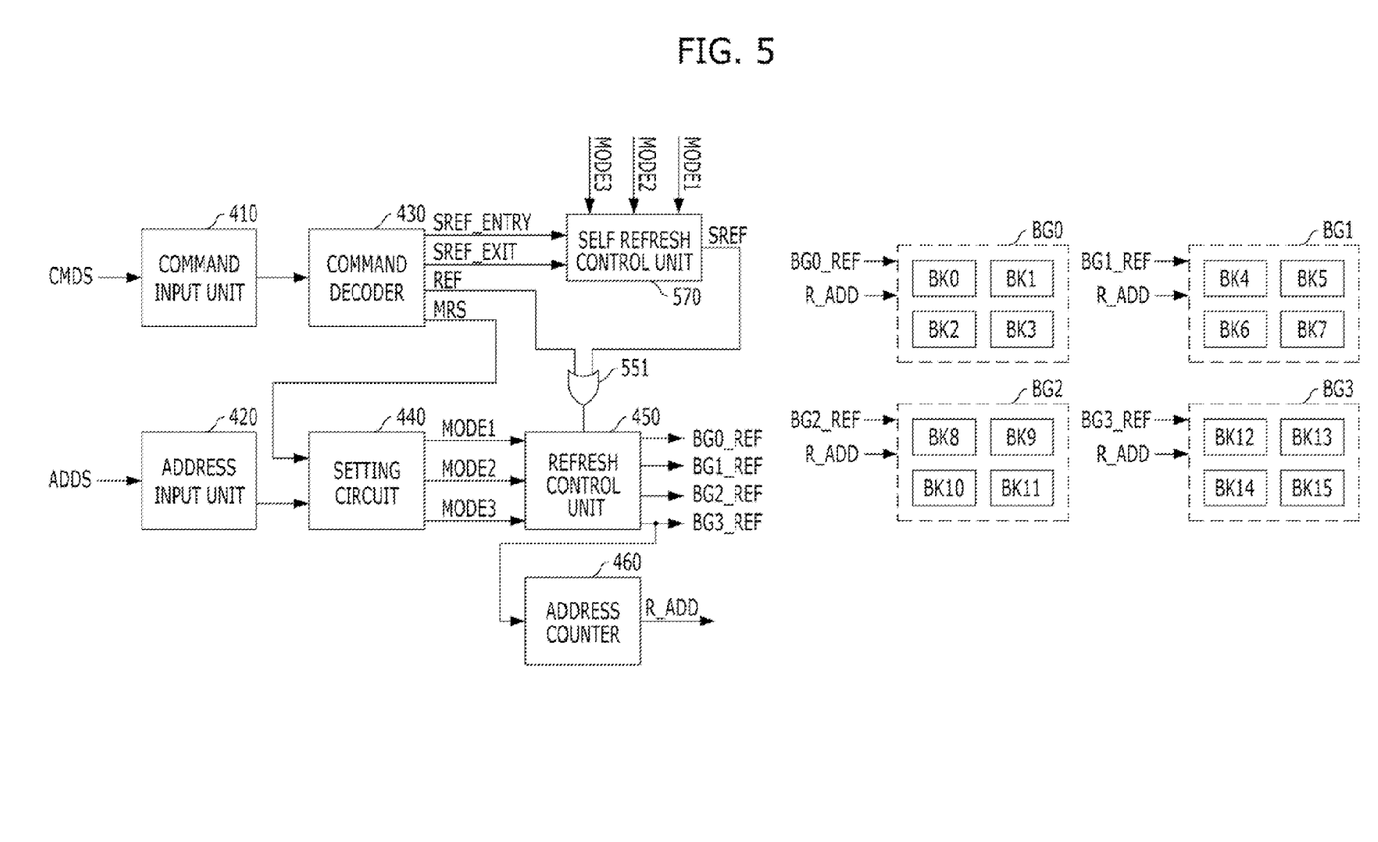
FIG. 5 is a diagram illustrating a memory device in accordance with another embodiment of the present invention.

FIG. 5 is a diagram illustrating a memory device in accordance with another embodiment of the present invention.

Referring to FIG. 5, a memory device may further include a self refresh control unit 570 than the embodiment described above with reference to FIG. 4. In this embodiment, the self refresh operation is performed by the same manner as the auto refresh operation.

The self refresh control unit 570 is operated in response to a self refresh entry command SREF_ENTRY and a self refresh exit command SREF_EXIT generated from the command decoder 430. The self refresh control unit 570 periodically activates the self refresh command SREF from the activation timing of the self refresh entry command SREF_ENTRY and stops the periodic activation of the self refresh command SREF from the activation of the self refresh exit command SREF_EXIT. That is, the self refresh control unit 570 periodically activates the self refresh command SREF during the self refresh operation period. The memory device itself needs to perform the periodic refresh operation during the self refresh operation period and the self refresh control unit 570 generates the internal command SREF for the periodic refresh operation.

The self refresh control unit 570 differently sets a period in which the self refresh command SREF is activated, depending on which refresh mode is set. The activation period of the self refresh command SREF is shorter toward the third mode from the first mode. For example, when the self refresh command SREF is activated for each time A in the first mode, the self refresh command SREF is activated for each time A/2 in the second mode and the self refresh command SREF is activated for each time A/4 in the third mode. The reason is that the number (for example, 16) of banks refreshed when the self refresh command is activated once in the first mode is twice as much as the number (for example, 8) of banks refreshed when the self refresh mode is activated once in the second mode and is four times as much as the number (for example, 4) of banks refreshed when the self refresh command is activated once in the third mode. The self refresh control unit 570 may be designed using an oscillator that is operated from the activation timing of the self refresh entry command SREF_ENTRY to the activation timing of the self refresh exit command SREF_EXIT and generates a command SREF of which the period is changed according to the mode signals MODE1 to MODE3.

The self refresh command SREF generated from the self refresh control unit 570 is input to the refresh control unit 450 through an OR gate 551. Further, the refresh control unit 450, the address counter 460, and the bank groups BG0 to BG3 are identically operated in both of the case in which the internal refresh command REF (that is, the auto refresh command) generated through the commands CMDs is activated and the case in which the self refresh command SREF generated from the self refresh control unit 570 is activated. That is, the self refresh operation of the memory device is identically performed with the auto refresh except that the self refresh operation is performed by the self refresh command SREF generated from the self refresh control unit 570.

In accordance with this embodiment described with reference to FIG. 5, the self refresh operation can be identically controlled with the auto refresh operation only by adding a simple component to the embodiment described with reference to FIG. 4.

Figure 6:
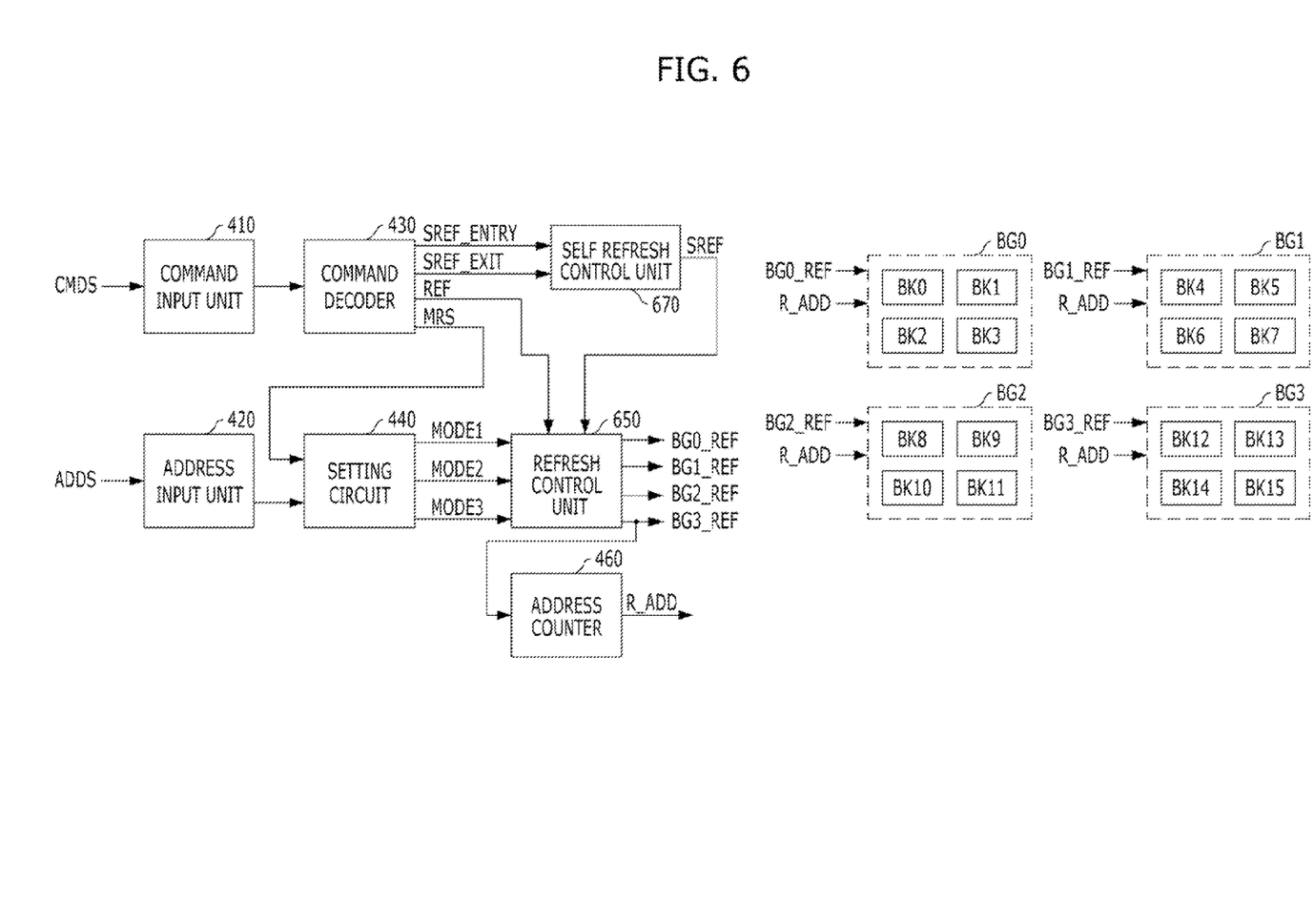
FIG. 6 is a diagram illustrating a memory device in accordance with still another embodiment of the present invention.

FIG. 6 is a diagram illustrating a memory device in accordance with still another embodiment of the present invention.

Referring to FIG. 6, the memory device further includes a self refresh control unit 670 in addition to the embodiment described with reference to FIG. 4 and an operation of the refresh control unit 650 is changed. In this embodiment, the self refresh operation is performed without the differentiation of the refresh mode, differently from the auto refresh operation.

The self refresh control unit 670 is operated in response to the self refresh entry command SREF_ENTRY and the self refresh exit command SREF_EXIT generated from the command decoder 430. The self refresh control unit 670 periodically activates the self refresh command SREF from the activation timing of the self refresh entry command SREF_ENTRY and stops the periodic activation of the self refresh command SREF from the activation of the self refresh exit command SREF_EXIT. That is, the self refresh control unit 670 periodically activates the self refresh command SREF during the self refresh operation period. In this embodiment, the activation period of the self refresh command SREF of the self refresh control unit 670 is not changed according to the refresh mode, differently from the embodiment described above with reference to FIG. 5. The reason is that in this embodiment, the self refresh operation is not changed according to the setting of the refresh mode.

The refresh control unit 650 receives the internal refresh command REF, the mode signals MODE1 to MODE3, and the self refresh command SREF. When the internal refresh command REF is activated, the operation of the refresh control unit is identically performed with the refresh control unit 450 of FIG. 4. When the self refresh command SREF is activated, the refresh control unit 650 is identically operated with the case in which the first mode is set, regardless of the mode signals MODE1 to MODE 3. That is, the refresh control unit simultaneously activates all the refresh signals BG0_REF to BG3_REF when the self refresh command SREF is activated.

The operations of the address counter 460 and the bank groups BG0 to BG3 are the same as ones described in FIGS. 4 and 5 and therefore, the description thereof will be omitted herein.

In accordance with this embodiment described with reference to FIG. 6, the self refresh operation identically operated at all times regardless of the refresh mode only by adding a simple component to the embodiment described with reference to FIG. 4 can be performed.

In accordance with the embodiments of the present invention, it is possible to support all the refresh operations with the single address counter while supporting the mode in which that refreshes all the banks by the refresh command and the mode in which some banks are refreshed.

Further, it may be possible to support the self refresh operation using the same circuit.

Although the spirit of the present invention was described in detail with reference to the preferred embodiments, it should be understood that the preferred embodiments are provided to explain, but do not limit the spirit of the present invention. Also, it is to be understood that various changes and modifications within the technical scope of the present invention are made by a person having ordinary skill in the art to which this invention pertains.

What is claimed is:

1. A memory device, comprising:
    a plurality of memory blocks configured to be refreshed in response to respective refresh signals;
    a command decoder configured to decode an external input command to generate an internal refresh command;
    a refresh control unit configured to activate a first number of refresh signals corresponding to the first number of memory blocks among the plurality of memory blocks when the internal refresh command is activated and a first mode is set, and to activate a second number of refresh signals corresponding to the second number of memory blocks among the plurality of memory blocks when the internal refresh command is activated and a second mode is set, the second number being smaller than the first number; and
    an address counter configured to change a row address used during a refresh operation and transferred to the memory blocks when a predetermined one of the refresh signals is activated.

2. The memory device of claim 1, wherein the predetermined one refresh signal is the last activated refresh signal among the refresh signals.

3. The memory device of claim 1, wherein the refresh control unit activates a third number of refresh signals when the internal refresh command is activated and a third mode is set, the third number being smaller than the second number.

4. The memory device of claim 3, further comprising:
    a setting circuit configured to set one of the first mode, the second mode, and the third mode in response to a signal input from the outside of the memory device.

5. The memory device of claim 3, wherein the first number is equal to the number of plurality of memory blocks, the second number is a half of the number of plurality of memory blocks, and the third number is a quarter of the number of plurality of memory blocks.

6. The memory device of claim 1, wherein each of the plurality of memory blocks is a bank group including at least one bank.

7. A memory device, comprising:
    a plurality of memory blocks configured to be refreshed in response to respective refresh signals;
    a command decoder configured to decode an external input command to generate an internal refresh command, a self refresh entry command, and a self refresh exit command;
    a self refresh control unit configured to start periodic activation of a self refresh command in response to the activation of the self refresh entry command and stop the activation of the self refresh command in response to the activation of the self refresh exit command;
    a refresh control unit configured to activate a first number of refresh signals corresponding to the first number of memory blocks among the plurality of memory blocks, when one of the internal refresh command and the self refresh command is activated and a first mode is set, and to activate a second number of refresh signals corresponding to the second number of memory blocks among the plurality of memory blocks, when one of the internal refresh command and the self refresh command is activated and a second mode is set, the second number being smaller than the first number; and
    an address counter configured to change a row address used during a refresh operation and transferred to the memory blocks when a predetermined one of the refresh signals is activated.

8. The memory device of claim 7, wherein the predetermined one refresh signal is the last activated refresh signal among the refresh signals.

9. The memory device of claim 7, wherein the refresh control unit activates a third number of refresh signals when one of the internal refresh command and the self refresh command is activated and a third mode is set, the third number being smaller than the second number.

10. The memory device of claim 9, further comprising:
    a setting circuit configured to set one of the first mode, the second mode, and the third mode in response to a signal input from the outside of the memory device.

11. The memory device of claim 9, wherein a period in which the self refresh control unit activates the self refresh command is different depending on which of the first mode, the second mode, and the third mode is set.

12. The memory device of claim 9, wherein the first number is equal to the number of plurality of memory blocks, the second number is a half of the number of plurality of memory blocks, and the third number is a quarter of the number of plurality of memory blocks.

13. A memory device, comprising:
    a plurality of memory blocks configured to be refreshed in response to respective refresh signals;

a command decoder configured to decode an external input command to generate an internal refresh command, a self refresh entry command, and a self refresh exit command;

a self refresh control unit configured to start periodic activation of a self refresh command in response to the activation of the self refresh entry command and stop the activation of the self refresh command in response to the activation of the self refresh exit command;

a refresh control unit configured to activate a first number of refresh signals corresponding to all of the plurality of memory blocks, when the internal refresh command is activated and a first mode is set, to activate a second number of refresh signals corresponding to the second number of memory blocks among the plurality of memory blocks, when the internal refresh command is activated and a second mode is set, the second number being smaller than the number of all of the memory blocks, and to activate the refresh signals corresponding to all of the plurality of memory blocks regardless of the setting of the first mode and the second mode when the self refresh command is activated; and an address counter configured to change a row address used during a refresh operation and transferred to the memory blocks when a predetermined one of the refresh signals is activated.

14. The memory device of claim 13, wherein the predetermined one refresh signal is the last activated refresh signal among the refresh signals in the second mode.

15. The memory device of claim 13, wherein the refresh control unit activates a third number of refresh signals when the internal refresh command is activated and a third mode is set, the third number being smaller than the second number.

16. The memory device of claim 15, further comprising:
a setting circuit configured to set one of the first mode, the second mode, and the third mode in response to a signal input from the outside of the memory device.

17. The memory device of claim 15, wherein the first mode is a fine granularity refresh (FGR) 1 mode, the second mode is a FGR2 mode, and the third mode is a FRG4 mode.

* * * * *